United States Patent [19]

Watanabe et al.

[11] Patent Number: 5,051,242

[45] Date of Patent: Sep. 24, 1991

[54] HEATING COIL FOR USE IN GROWTH OF SINGLE CRYSTAL

[75] Inventors: Masataka Watanabe, Niigato; Katsumi Ichimura, Arai, both of Japan

[73] Assignee: Shin-Etsu Handotai Co., Ltd., Tokyo, Japan

[21] Appl. No.: 512,114

[22] Filed: Apr. 20, 1990

[30] Foreign Application Priority Data

Apr. 26, 1989 [JP] Japan .................... 1-107980

[51] Int. Cl.$^5$ .................... H05B 6/44; C30B 13/20
[52] U.S. Cl. .................... 422/250; 156/617.1; 156/620.73; 156/620.74; 156/620.75
[58] Field of Search ........... 156/617.1, 620.73, 620.74, 156/620.75; 422/250

[56] References Cited

U.S. PATENT DOCUMENTS

| Re. 29,825 | 11/1978 | Keller | 422/250 |
| 4,072,556 | 2/1978 | Schmidt | 422/250 |
| 4,851,628 | 7/1989 | Ammon et al. | 219/10.43 |

FOREIGN PATENT DOCUMENTS

| 0288880 | 11/1988 | European Pat. Off. | |
| 0292920 | 11/1988 | European Pat. Off. | |
| 2812216 | 10/1979 | Fed. Rep. of Germany | 422/250 |
| 3007377 | 9/1981 | Fed. Rep. of Germany | 422/250 |
| 1-131094 | 5/1989 | Japan | 422/250 |
| 792166 | 3/1958 | United Kingdom | |

Primary Examiner—Olik Chaudhuri
Assistant Examiner—Felisa Garrett
Attorney, Agent, or Firm—Oliff & Berridge

[57] ABSTRACT

A coil for use in growing a single crystal by using a floating zone method is formed as an annular single-turn coil having a wedge-like configuration in vertical section so as to progressively increase in thickness from inner circumference to outer circumference of the coil. The surface of the annular body of the coil positioned on the polycrystalline side is radially sloped upward, around the circumferences, with an elevation angle with respect to a plane perpendicular to the crystal growth axis. The coil has an annular thin projection, which projects upwardly from the coil on the polycrystalline side, is planted at or near the inner circumference thereof. The annular thin projection serves to increase magnetic flux density around its tip portion, thereby enabling polycrystalline portion near the tip portion to be easily melted so that the polycrystalline portion positioned above the annular projection forms a slight recess, which is configured so as to overhang slightly downward near the edge and cover a substantial portion of the top side of the coil. Accordingly, dissipation of heat is suppressed and generation of an icicle-like projection prevented.

2 Claims, 2 Drawing Sheets

HEATING COIL FOR USE IN GROWTH OF SINGLE CRYSTAL

BACKGROUND OF THE INVENTION

1. Field of the Invention

The present invention relates generally to single-crystal growth techniques and, more particularly, to a coil for use in single-crystal growth utilizing a floating zone (FZ) method.

2. Description of the Related Art

A floating zone (FZ) method is one single-crystal growth method. In the floating zone method, a vertically held polycrystalline rod is partly transformed to melt at the bottom end by high-frequency induction heating and the bottom end is relatively moved to and fused with the tip of a seed crystal thin rod with a definite crystallographic orientation which is held under the polycrystalline rod coaxially thereto by means of high frequency induction heating and the tip coalesces with the melt and is partly molten. Then the melt is gradually moved toward the polycrystalline rod with a coil for the high-frequency induction heating, whereby a single crystal is successively grown.

In the single-crystal growth utilizing the floating zone method, for example, the coil shown in FIG. 4 is usually used.

A coil 1 is formed as an annular single-turn coil having a wedge-like configuration in vertical section. The coil 1 is also formed to have a thickness which progressively increases from inner circumference to outer circumference, so that the top side (or surface positioned on the polycrystalline side) is inclined downward in the radially inward direction.

When a single crystal is to be grown by using the coil 1, a high-frequency current is made to flow in the coil 1 and a coolant is supplied to the interior of the coil 1 to prevent overheating. Thus, the energy required for melting is given to the polycrystalline rod $2a$ while the overheating of the coil 1 is being prevented, thereby melting the polycrystalline rod $2a$ to form a molten zone. A single-crystal rod $2b$ is produced by progressively moving the molten zone toward the polycrystalline side together with the coil 1. The coil 1 is made of copper, silver or a combination of copper and silver plating on it, and its surface is finished as a rough surface.

However, the above-described conventional single-crystal growth technique utilizing the aforesaid coil 1 has a number of problems.

For example, the coil 1 has an inner circumferential end which is extremely reduced in thickness, and the area in which this inner circumferential end face opposes a semiconductor rod 2 is extremely limited. As a result, although the supply of energy to the neck portion of the molten zone of the semiconductor rod 2 can be restricted to a miniature area, the absolute amount of energy which can be supplied is also restricted and it becomes difficult to perfectly melt the semiconductor rod 2 up to the core thereof. Accordingly, a solid-phase polycrystalline region remains at or near the core of the semiconductor rod 2, and the crystallinity of the resulting single crystal may not be perfect. In this case, even if the polycrystalline rod typically has a molten-liquid outer portion, the interior remains unmolten. This remaining unmolten portion, which extends to the vicinity of the middle of the molten zone, becomes gradually thinner downwardly along its length. The remaining unmolten or polycrystalline portion occasionally extends into close proximity to or contact with a single-crystal portion formed below the polycrystalline portion, thereby degrading the quality of the single crystal. In addition, the remaining polycrystalline portion may influence the molten liquid flow or others in the molten zone, causing the variation of cross-sectional resistivity of the growing crystal. Particularly, this tendency outstandingly appears when the diameter of the polycrystalline rod $2a$ is relatively large.

The molten zone and the portion of the semiconductor rod 2 which is being melted on the polycrystalline side has a configuration which enlarges radially upward from the neck portion of the molten zone. This configuration allows heat to easily dissipate and, therefore, the outer portion where melting starts on the polycrystalline side is kept at a low temperature. As a result, an icicle-like projection 3 may be formed there. As the semiconductor rod 2 moves downwardly, the projection 3 collides with the coil 1, thereby causing electrical discharge to start there or disabling the relative movement of the coil 1 and the semiconductor rod 2.

SUMMARY OF THE INVENTION

It is therefore an object of the present invention to provide a coil which makes it possible to produce a single crystal having excellent crystalline properties and cross-sectional resistivity whose variation is suppressed.

It is another object of the present invention to provide a coil which enables a highly stable operation in single-crystal growth.

To achieve the above objects, in one specific form of the present invention, there is provided an improvement in a coil for use in growing a single crystal by using a floating zone method. The improved coil is formed as an annular single-turn coil having a wedge-like configuration in vertical section so as to progressively increase in thickness from inner circumference to outer circumference of the coil so that the surface of the annular body of the coil positioned on the polycrystalline side is radially sloped upward from the center, around the circumferences, with an elevation angle with respect to a plane perpendicular to the crystal growth axis. The coil has an annular thin projection which is formed at or near the inner circumference thereof so as to project upwardly from the coil on the polycrystalline side. The present invention further embraces an improvement in the surface condition of the circumferential portion of the coil on the the circumferential portion of the coil on the polycrystalline side. In accordance with another aspect of the improvement, the surface is finished as a mirror surface.

According to the aforesaid arrangement, since the coil has the annular thin projection formed at or near its inner circumferential end, energy applied to the semiconductor rod increases to reduce the size of a semiconductor unmelted portion contained inside the molten zone. Accordingly, it is possible to provide a single crystal which excels in crystal property and cross-sectional resistivity distribution.

Moreover, the presence of the annular projection serves to increase magnetic flux density at the tip portion of the annular thin projection. Accordingly, the polycrystalline portion which is positioned above the tip portion of the annular projection, is selectively more molten and the circumferential portion of the polycrystalline rod is profiled as slightly hanging down near the edge. Accordingly, heat is accumulated between the surface facing downward of the polycrystalline rod adjacent to the melt and the top side of the coil and dissipation of heat to the exterior is suppressed. Accordingly, the heat generated by the coil is effectively consumed in the polycrystalline rod so that the formation of icicle-like projections at the outermost circumference is prevented. In addition, since the upper surface of the annular body of the coil is formed as a mirror surface, it is possible to further enhance the heating efficiency by utilizing the reflection of heat from the mirror surface.

Further objects, features and advantages of the present invention will become apparent from the following detailed description of an embodiment of the present invention with reference to the accompanying drawings.

DESCRIPTION OF THE PREFERRED EMBODIMENT

An embodiment of a coil for single-crystal growth according to the present invention will be explained below with reference to the accompanying drawings.

Figure 1:
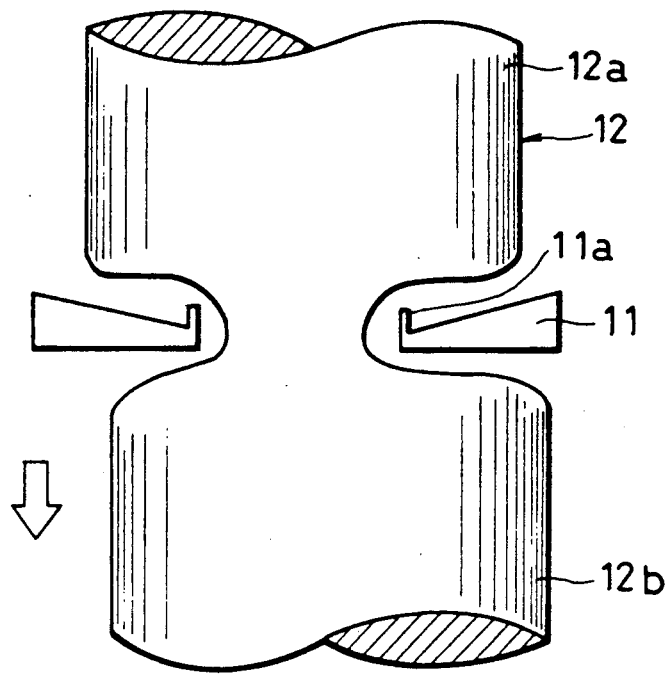
FIG. 1 is a partial cross-sectional view showing in front elevation an embodiment of a coil for single-crystal growth according to the present invention and a semiconductor rod to be processed by means of the embodiment.

FIG. 1 schematically shows the embodiment of the coil for single-crystal growth and a semiconductor rod.

As illustrated, a coil 11 is formed as an annular single-turn coil having a wedge-like configuration in vertical section. The coil 11 is formed to progressively increase in thickness from inner circumference to outer circumference thereof so that the top side (or surface positioned on the polycrystalline side) of the annular body of the coil 11 is radially sloped upward from the center, around the circumferences, with an elevation angle with respect to a plane perpendicular to the crystal growth axis. An annular thin projection 11a, which projects upwardly from the coil 11, is formed at or near the inner circumference thereof. When a single crystal is to be grown by means of the coil 11, a high-frequency current is applied to the coil 11 to produce an eddy current in the semiconductor rod 12, thereby melting the polycrystalline rod 12 to form a molten zone thereof. The molten zone is caused to progressively move up along the longitudinal axis of the semiconductor rod 12 with the relative downward movement of the semiconductor rod 12. During this time, to cool the coil 11, a coolant is preferably supplied in the coil 11.

It is to be noted that, although the coil 11 may be made of copper, silver or a combination of copper and silver plating on the former, its surface is preferably finished as a mirror face.

The coil 11 having the above-described configuration and arrangement provides various advantages as follows.

For instance, since the coil 11 of the present embodiment has the annular projection 11a at or near the inner circumference, large energy is given to the semiconductor rod 12 by the annular thin projection 11a. In consequence, the energy of the eddy current is highly intensified in the neck portion of the melted zone of the semiconductor rod 12 during operation, whereby the polycrystalline rod of semiconductor rod 12 is effectively molten up to its core in the molten zone. Accordingly, it is possible to eliminate a solid phase which may occur at or near the center of the molten zone of the semiconductor rod 12 in the vicinity of the growing front during single-crystal growth, and a single crystal having excellent crystalline properties can be obtained.

The annular thin projection 11a serves to increase magnetic flux density at its tip portion, thereby accelerating the melting of the part of a polycrystalline rod portion 12a which is positioned near the tip portion. The surface portion facing downward of the polycrystalline rod portion 12a which is profiled as slightly hanging down near the outer circumference, opposes the top side of the coil 11 and covers a substantial portion of the coil 11.

Heat is therefore accumulated between the bottom face of the semiconductor rod 12 and the top side of the coil 11. Accordingly, the heat is effectively consumed in the interior of the semiconductor rod 12 so that the formation of icicle-like projections is prevented.

Moreover, electromagnetic forces applied by the annular projection 11a increase the retentiveness of the neck portion, so that the semiconductor rod 12 is prevented from being broken around the neck portion.

To confirm the advantage of improving resistivity distribution in the cross section of the semiconductor rod 12, the following experiment was conducted.

Specifically, the cross-sectional resistivity distribution of a semiconductor crystal rod fabricated by using a conventional coil for single-crystal growth was compared with the cross-sectional resistivity distribution of a semiconductor crystal rod fabricated by using by the present inventive coil for single-crystal growth. The conditions used for single-crystal growth and the experiment result are as follows.

I. Conditions

Growth of a N-type single crystal having a crystal orientation <111> was conducted with both the single-turn copper coil 11 having the annular thin projection 11a and a conventional single-turn copper coil having no annular projection.

The diameter of the single crystal was 78.5 mm, and a polycrystalline rod having an approximate diameter was used. The coil used was a flat single-turn coil having an inner diameter of 45 mm and an outer diameter of 120 mm, and the coil according to the present invention had the annular projection 11a with a height of 5 mm around its inner circumference.

The revolution of the semiconductor rod 12 during the single-crystal growth was set to 5 rpm, and the eccentric distance between the polycrystalline rod portion 12a and the single-crystal rod portion 12b was set to 3 mm.

II. Result

Figure 2:
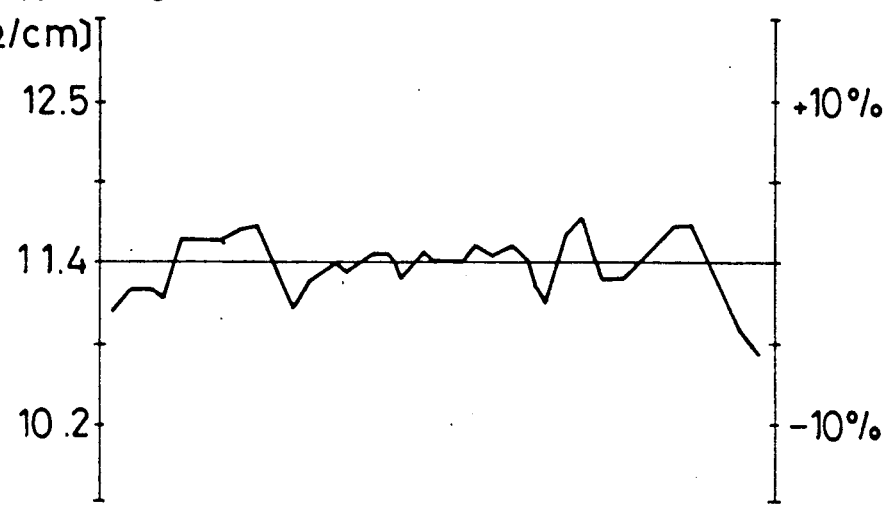
FIG. 2 is a graphic representation showing the cross-sectional resistivity distribution of a sample fabricated by using the coil according to the present invention.
Figure 3:
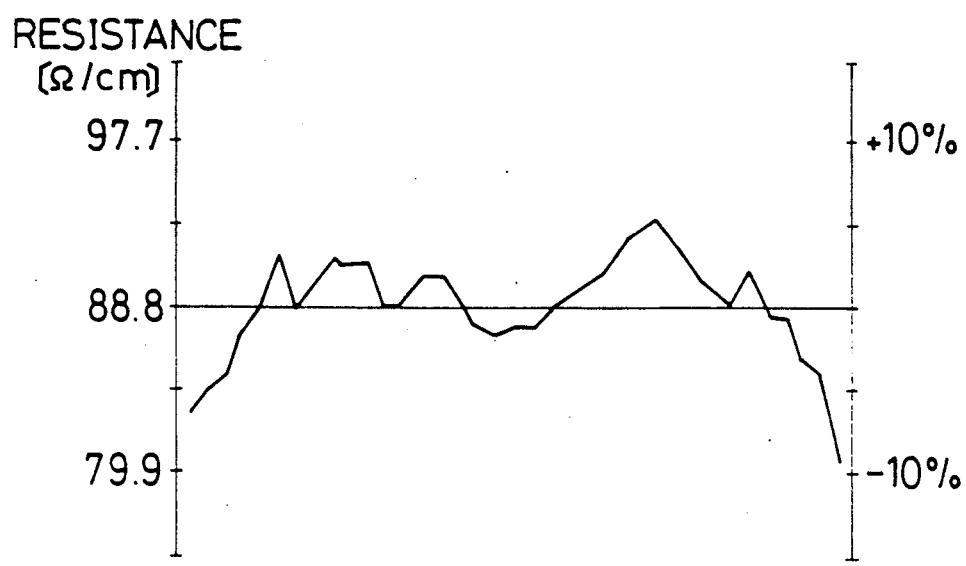
FIG. 3 is a graphic representation showing the cross-sectional resistivity distribution of a sample fabricated by using a conventional coil.
Figure 4:
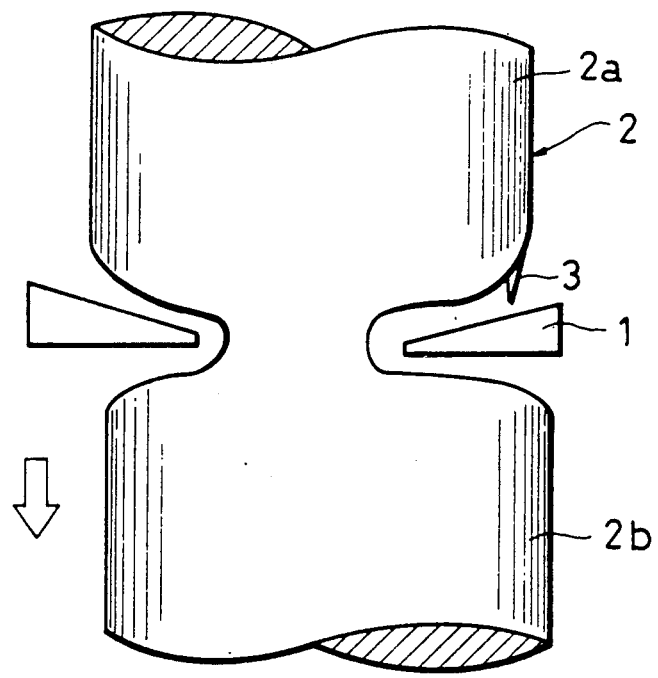
FIG. 4 is a partial cross-sectional view showing in front elevation the conventional coil and a semiconductor rod to be processed by means of the convention coil.

The result is shown in FIGS. 2 and 3.

FIG. 2 shows the cross-sectional resistivity distribution of a particular semiconductor substrate which was cut from the single-crystal rod portion 12b fabricated by using the present inventive coil 11.

FIG. 3 shows the cross-sectional resistivity distribution of a particular semiconductor substrate which was cut from the single-crystal rod fabricated by using the conventional coil.

Each of the cross-sectional resistivity distributions was measured at 37 points selected from a particular cross section of the sample which crossed the axis thereof at right angles. A measurement starting point was set to 3 mm inward from the outer circumference, and corresponding two points positioned equidistantly away from the outer circumference were averaged.

As can be seen from FIGS. 2 and 3, the semiconductor substrate shown in FIG. 3, that is, the one fabricated by using the conventional coil, exhibits low resistivity around the central portion with respect to the semiconductor substrate of FIG. 2, fabricated by using the present inventive coil. The phenomenon which was experienced with the conventional coil is attributed to the influence of an unmolten portion which remained in a molten zone adjacent to the growing front of the sample during single-crystal growth.

In addition, as is evident from FIGS. 2 and 3, the semiconductor crystal rod fabricated by using the present inventive single-turn copper coil 11 having the annular thin projection 11a exhibits a small value of RRG, that is, $$\frac{R\max - R\min}{R\min} \times 100 \, [\%]$$

with respect to the semiconductor crystal rod fabricated by using the conventional coil.

While the invention made by the present inventor has been described with reference to a particular embodiment, this description is solely for the purpose of illustration and is not to be construed as limiting the scope of the invention claimed below. As a matter of course, various modifications, changes, and applications may be made by those skilled in the art without departing from the true scope and spirit of the invention as defined by the appended claims.

As is apparent from the foregoing description of the specific embodiment, the present invention disclosed in this application achieves advantages as follows.

An improved coil for use in growing a single crystal by using a floating zone method is formed as an annular singleturn coil having a wedge-like configuration in vertical section so as to progressively increase in thickness from inner circumference to outer circumference of the coil so that the surface of the annular body of the coil positioned on the polycrystalline side rapidly sloped upward, around the circumferences, with an elevation angle with respect to a plane perpendicular to the crystal growth axis. The coil has an annular thin projection which is formed at or near the inner circumference thereof so as to project upwardly from the coil on the polycrystalline side. The annular thin projection serves to increase magnetic flux density around its tip portion. Accordingly, the polycrystalline portion, which is positioned near the tip portion of the annular thin projection, is easily melted so that the polycrystalline portion positioned above the annular thin projection forms a slight recess which makes the contour of the surface facing down of the above just mentioned polycrystalline portion overhang slightly downward near the edge covering a substantial portion of the top side of the coil. Accordingly, dissipation of heat is suppressed and generation of an icicle-like projection is prevented.

The presence of the annular thin projection makes it possible to intensify eddy currents in the vicinity of the neck portion of the molten zone, whereby it is possible to effectively melt the semiconductor crystal rod in the molten zone. Accordingly, it is possible to provide a single crystal having excellent crystalline properties and improved cross-sectional resistivity distribution.

What is claimed is:

1. An annular single-turn coil for use in growing a single crystal by using a floating zone method, said coil being formed to have a wedge-like configuration in vertical section so that a polycrystal side surface of the annular body of said coil is radially sloped upwards with an elevation angle with respect to a plane perpendicular to the axis of crystal growth around the circumferences of said coil, said coil comprising an annular thin projection which is formed at or near the inner circumference thereof and projects upwards from the polycrystal side surface of said coil towards the bottom surface of the polycrystalline rod.

2. An annular single-turn coil according to claim 1, wherein said surface of said coil positioned on said polycrystalline side is finished as a mirror surface.

* * * * *